United States Patent
Hayashi

(10) Patent No.: US 7,415,053 B2
(45) Date of Patent: Aug. 19, 2008

(54) OPTICAL TRANSMITTER WITH A LEAST PAIR OF SEMICONDUCTOR LASER DIODES

(75) Inventor: Shigeo Hayashi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/367,712

(22) Filed: Mar. 6, 2006

(65) Prior Publication Data

US 2006/0203863 A1    Sep. 14, 2006

(30) Foreign Application Priority Data

Mar. 7, 2005    (JP) .................. P. 2005-062876

(51) Int. Cl.
*H01S 3/00* (2006.01)
*H04B 10/12* (2006.01)

(52) U.S. Cl. ................. 372/38.02; 372/38.07; 398/195; 398/197; 398/198

(58) Field of Classification Search .............. 372/38.02, 372/38.07, 33, 29.012, 50.12, 38.1, 29.013, 372/23, 29.015, 38.01; 398/136, 138, 195, 398/197, 198
See application file for complete search history.

(56) References Cited

U.S. PATENT DOCUMENTS

| | | | | |
|---|---|---|---|---|
| 3,551,848 A | * | 12/1970 | Rossoff | 359/238 |
| 5,262,741 A | * | 11/1993 | Kitakubo | 333/81 R |
| 5,600,472 A | * | 2/1997 | Uesaka | 398/158 |
| 5,758,644 A | * | 6/1998 | Diab et al. | 600/323 |
| 5,920,583 A | * | 7/1999 | Chen et al. | 372/34 |
| 6,445,474 B1 | * | 9/2002 | Dubos et al. | 398/141 |
| 6,465,967 B2 | * | 10/2002 | Tsujikawa et al. | 315/169.1 |
| 6,759,897 B2 | * | 7/2004 | Ciemniak | 327/553 |
| 6,798,801 B2 | * | 9/2004 | Johnson | 372/38.02 |
| 2003/0043869 A1 | * | 3/2003 | Vaughan | 372/38.02 |

FOREIGN PATENT DOCUMENTS

| | | |
|---|---|---|
| JP | 05-091056 | 4/1993 |
| JP | 2002-111601 | 4/2002 |
| JP | 2003-188824 | 7/2003 |

* cited by examiner

*Primary Examiner*—Minsun Harvey
*Assistant Examiner*—Joshua King
(74) *Attorney, Agent, or Firm*—Smith, Gambrell & Russell, LLP

(57) ABSTRACT

The present invention is to provide an optical transmitter with reduced power consumption. The optical transmitter includes two laser diodes connected in series to each other, one of which is connected in the anode thereof to the first driver, while the other of which is connected in the cathode thereof to the second driver. Further, between the anode of the first laser diode and the cathode of the second laser diode connects an impedance device. In the present invention, the first and second laser diodes, and the impedance device have the substantially same impedance to each other within a concerned frequency range.

5 Claims, 4 Drawing Sheets

OPTICAL TRANSMITTER WITH A LEAST PAIR OF SEMICONDUCTOR LASER DIODES

BACKGROUND OF THE INVENTION

1. Field of the Invention

The present invention relates to an optical transmitter

2. Related Prior Art

Generally, an optical transceiver includes a light-emitting device and a light-receiving device within each assembly, and these assemblies are installed in a package accompanied with an electronic circuit. Moreover, in an optical communication system configured with the multi signal channel, a multi-channeled optical transceiver is applied. Japanese Patent published as JP-H05-091056A and JP-2002-111601A have disclosed typical multi-channel transceiver.

The multi-channeled optical transceiver generally provides subject such as (1) to reduce power consumption, and (2) to decrease a count of lead pins in assemblies installing the light-emitting device and the light-receiving device. In the optical transceiver disclosed in aforementioned Japanese Patents, JP-H05-091056A and JP-2002-111601A, the power consumption reaches at least $N \times V_0 \times I_{LD}$, where N, $V_0$, and $I_{LD}$ are the count of channels, the power supply voltage, and the average current flowing in the light-emitting device, respectively.

One method to reduce the power consumption has been disclosed in Japanese Patent published as JP-2003-188824A, in which the optical transceiver installs a transmitting optical subassembly (TOSA) including a semiconductor laser diode. This laser diode within the TOSA is driven by a paired transistor constituting a differential circuit with a common emitter. One of paired transistor, not connected to the laser diode, is used to supply a portion of the bias current of the laser diode. Thus, the power consumption can be reduced.

Assuming a case that the multi-channeled optical transmitter is configured based on a optical transmitter shown in Japanese Patent published as JP-2003-188824A, the total power consumption $P_0$ of the multi-channeled optical transmitter becomes;

$$P_0 = N^* V_0^* I_H,$$

where N, Vo and IH are the count of channels, the power supply voltage, and the bias current for the LD when the LD turns on, respectively. In this case, the LD is driven by the differential circuit, namely, the LD is configured as a load device for a transistor constituting the difference circuit. The power consumption above becomes lower than that when the LD is driven by a conventional driver, in which the power consumption becomes $$P_0 = N^* V_0^* (I_H + I_L),$$

where IL denotes the bias current for the LD when the LD turns off.

Generally, the low-level current $I_L$ is merely 10~20% of the high-level current $I_H$. Moreover, the former current $I_L$ is determined by the threshold current of the LD, and recently developed LDs have relatively smaller threshold current. Thus, the reduction of the power consumption of the transmitter becomes harder in optimizing the structure and the material of the LD.

Therefore, the present invention is to provide an optical transmitter that installs a plurality of LDs and reduces the power consumption thereof.

SUMMARY OF THE INVENTION

An optical transmitter of the present invention comprises two laser diodes (LD), two drivers, an impedance device, and a compensating circuit. Two LDs are connected in series to each other, namely, the cathode of the first LD is connected to the anode of the second LD. One of drivers drives the anode of the first LD, while, the other driver drives the cathode of the second LD. The impedance element is connected between the anode of the first LD and the cathode of the second LD. The compensating circuit is connected to both the cathode of the first LD and the anode of the second LD. The optical transmitter of the present invention has a feature that the impedance device and two LDs have substantially same impedance. Moreover, the impedance viewed from the anode of the first LD, that viewed from the cathode of the second LD, and that viewed from both the cathode of the first LD and the anode of the second LD, are substantially same with each other.

Since two LDs are connected in series, the current flowing in the first LD flows in the second LD, the current provided from the power supply of the optical transmitter may be reduced, thereby decreasing the power consumption of the optical transmitter.

Where, the substantially same impedance means, not only a case that the impedance is identical to each other, but also a case that the impedance of two devices is slightly different as long as the contribution from the second driver to the optical output of the first LD and that from the first driver to the optical output of the second LD are suppressed within a practically acceptable level.

The compensating circuit may include a resistor with one terminal thereof connected to the cathode of the first LD and the anode of the second LD, while the other terminal of the resistor is grounded.

The optical transmitter may further include first and second resistors. The anode of the first LD may be connected to the first driver through the first driver. The cathode of the second LD may be connected to the second driver through the second resistor. These first and second resistors may adjust respective impedance viewed from the anode of the first LD to the first driver, and that viewed from the cathode of the second LD to the second driver.

The compensating circuit may flow or sink a compensating current to equalize an output power of the first LD to an output power of the second LD.

Moreover, the optical transmitter may further include a photodiode for monitoring the output power of at least one of the first LD and the second LD, and outputs a compensating signal. The compensating circuit may adjust the compensating current based on this compensating signal sent from the photodiode.

DESCRIPTION OF PREFERRED EMBODIMENTS

Figure 1:
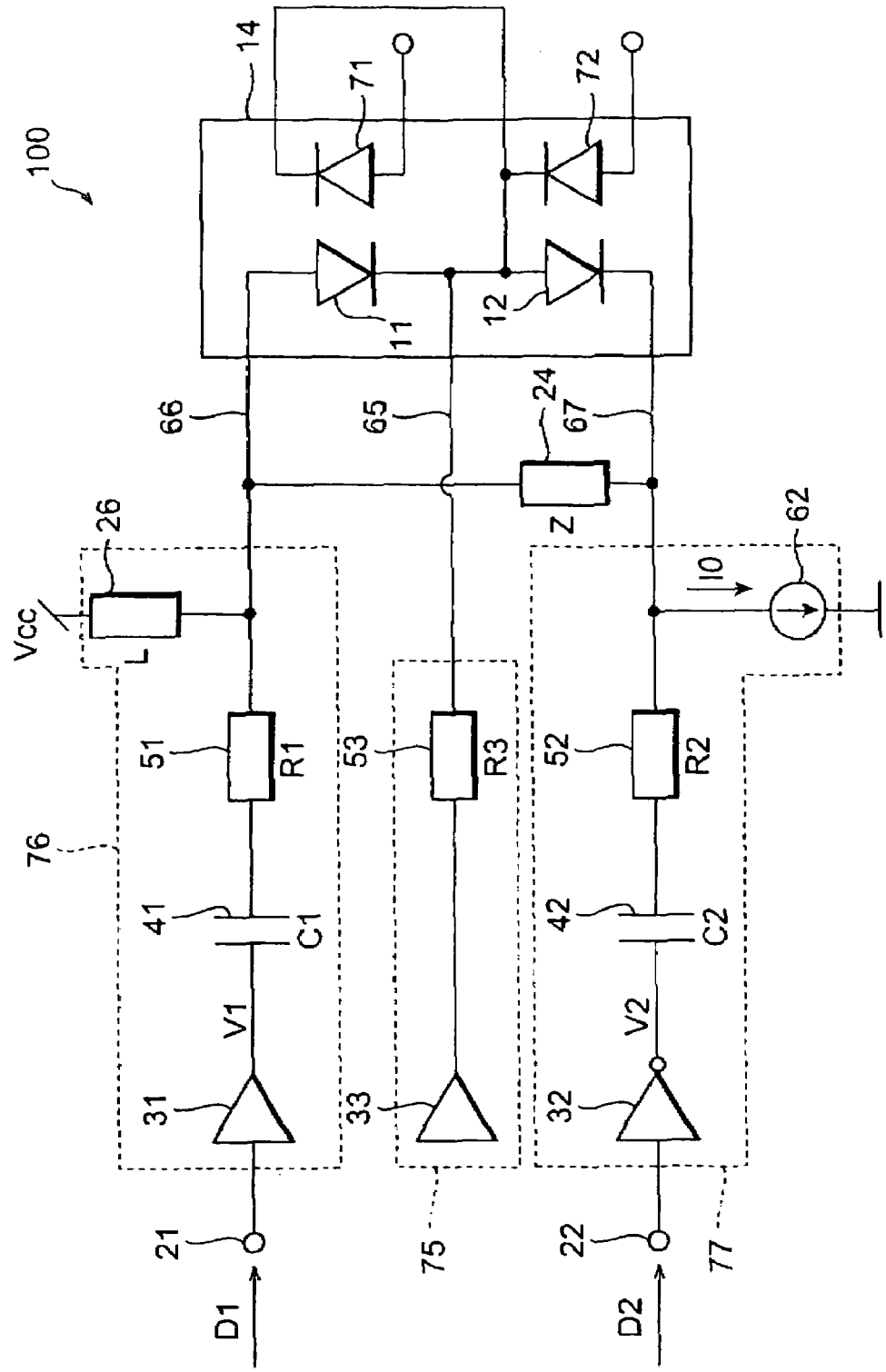
FIG. 1 is a circuit diagram of the optical transmitter according to the first embodiment of the present invention.

Next, preferred embodiments of the present invention will be described as referring to accompanying drawings. In the drawings and explanations below, the same numerals and symbols will refer to the same elements without overlapping explanations.

First Embodiment

FIG. 1 shows an optical transmitter according to the first embodiment of the invention. The optical transmitter 100 configures the two-channel optical transmitter including two laser diodes (hereinafter denoted as LD), 11 and 12. These two LDs are assembled within a same package 14 and connected in series to each other. However, these LDs may have an electrically isolated configuration to be integrated within a same chip. The cathode of the LD 11 is connected to the anode of the other LD 12. These LDs have the same material and are manufactured in the same process, accordingly, have substantially same electrical characteristic including the impedance thereof.

The anode of the LD 11 connects the output of the driver 31 via a capacitor 41 and a resistor 51, while the cathode of the LD 12 connects the output of the driver 32 via a capacitor 42 and a resistor 52. These drivers, 31 and 32, generate modulation signals each supplied to the LDs, 11 and 12, respectively. Details of the drivers, 31 and 32, will be described later.

The optical transmitter 100 has two input terminals, 21 and 22, for receiving signals, D1 and D2, from the signal generator, not shown in FIG. 1. The input signals, D1 and D2, are transmitted to LDs, 11 and 12, on signal lines, 66 and 67, respectively, as a voltage signal. The input terminals, 21 and 22, are connected to the input of respective drivers, 31 and 32, to generate modulations signals, V1 and V2, corresponding to received signals, D1 and D2. These modulation signals, V1 and V2, are configured in a digital form. Thus, the optical transmitter 100 drives two LDs, 11 and 12, by the modulation signals, V1 and V2, to generate optical signals corresponding to received signals, D1 and D2.

The drivers, 31 and 32, as explained above, generates the modulation signals, V1 and V2, corresponding to the received signals, D1 and D2, and may be a voltage amplifier. The drivers, 31 and 32, receiving the signals corresponding to the input data signals, D1 and D2, output the modulation signals, V1 and V2, in the output terminals thereof. The first driver 31 has a non-inverting configuration, in which the phases of the input and output signals coincide to each other, while the other driver 32 has an inverting configuration that reverses the phase of the output signal with respect to the input signal. This is due to the circuit diagram that the output of the driver 31 is connected to the anode of the LD 11, while that of the other driver 32 is connected to the cathode of the LD 12. The optical transmitter 100 may have a configuration that the driver 31 is the inverting amplifier, while the other driver 32 is the non-inverting amplifier.

The modulation signals thus generated are applied to the anode of the LD 11 and the cathode of the LD 12 via capacitors, 41 and 42, and resistors, 51 and 52.

Between the resistor 51 and the anode of the LD 11 is connected to the power supply $V_{CC}$ via the inductor 26 that prevents the modulation signal from leaking to the power supply $V_{CC}$. When the drivers, 31 and 32, have enough capacity to drive the LDs, the inductor 26 may be replaced with a resistor.

Between the resistor 52 and the cathode of the LD 12 is connected to the current source 62 that generates a DC current I0 to supply the bias current to the LDs, 11 and 12. The capacitors, 41 and 42, prevent this DC bias current from flowing into the drivers, 31 and 32.

Between the resistors, 51 and 52, is connected with an impedance device 24 that, as explained later in this specification, shows the substantially same impedance with LDs, 11 and 12, within an operative frequency range.

Between the LDs, 11 and 12, is connected to a compensating circuit 33 via a resistor 53. This compensating circuit 33 is configured to supply or sink a compensating current to adjust the current flowing in the LD 11, thus, equalizes output magnitude from respective LDs, 11 and 12. The magnitude of the compensating current coincides with the difference between currents flowing in LDs, 11 and 12. Thus, by adjusting the compensating current in the magnitude thereof, the optical output power from respective LDs, 11 and 12, may be equalized.

The compensating circuit 33 may be a current source and a voltage source. When the compensating circuit 33 is a voltage source, the bias conditions of the LDs, 11 and 12, are determined depending on the output voltage from the compensating circuit 33, accordingly, the bias current to the LDs are decided. When the compensating circuit 33 is a current source, the output current from the circuit 33 is supplied to the LD 12 or a portion of the bias current flowing in the LD 11 is sank into the circuit 33. Thus, the bias currents flowing in respective LDs are determined. In both cases, the difference in the bias currents flowing respective LDs is sank into the circuit 33 or is supplied to as a compensating current.

It is preferable that, when a circuit with relatively higher output impedance is used such as the current source of the compensating circuit 33 in the present invention, the output of the circuit is bypassed to the ground to lower the output impedance thereof.

Within the package 14 is installed with two photodiodes (hereinafter dented as PD), 71 and 72, to monitor the optical outputs of the LDs, 11 and 12, and to generate the photocurrents corresponding thereto. The outputs of the PDs, 71 and 72, are feedback to the current source 62. Moreover, one of outputs, 71 and 72, is also feedback to the compensating circuit 33. The current source 62 adjusts the output current I0 therefrom depending on the outputs of the PDs, 71 and 72, to keep the optical outputs from the LDs, 11 and 12, to be a predetermined value. The compensating circuit 33 adjusts the compensating current depending on the outputs from the PDs, 71 and 72, to equalize the optical outputs from the LDs, 11 and 12.

The extinction ratio of each LD, 11 or 12, is determined by the swing voltage of the driver, 31 or 32. Accordingly, the outputs from the PDs, 71 and 72, may be feedback to the drivers, 31 and 32. In this case, the drivers, 31 and 32, adjust the output swing voltage thereof depending on the outputs from the PDs, 71 and 72.

Although in the explanation above, the output of the compensating circuit 33 is controlled by feedback from the outputs of the PDs, 71 and 72, the output of the compensating circuit 33 may be fixed when it is unnecessary to control optical output from the LDs precisely. Or, in another configuration, the output of the compensating circuit 33 may be roughly adjusted depending on the output of a temperature sensor, not shown in FIG. 1. When a difference in the characteristic between two LDs is so small, or a required accuracy in the control of the optical output from the LDs is coarse enough, the compensating circuit 33 may be omitted. In such case, a capacitor with large capacitance is preferable to replace the compensating circuit 33.

Next, features of the circuit shown in FIG. 1 according to the first embodiment will be described. An optical transmitter generally has a power supply of 3.3 V or 5.0 V. Although it may be desired to lower power supply voltage, the power supply voltage should not lower more than about 3.0 V to drive electronic circuits stably. On the other hand, typical LDs for the optical communication, whose wavelengths are generally 0.8 μm, 1.3 μm, and 1.55 μm, require only 2.0 V, 1.5 V, and 1.2 V, respectively, as the forward voltage, which depends on the band gap energy of materials used in the LDs. Estimating future development of the LD in the emission efficiency, the forward voltage may lower 1.55 V, 0.95 V, and 0.80 V, for respective types thereof. Therefore, a circuit has been desired for LD operating efficiency.

The circuit shown in FIG. 1 may be introduced to consume power effectively. When more than three LDs are connected in series, lack of power supply voltage may occur. Accordingly, the circuit shown in FIG. 1 connects two LDs in series. In this circuit, it may be important that the operation of one LD does not affect the operation of the other LD.

The present circuit may cancel the interaction between two different channels without stabilizing the voltage between two LDs, 11 and 12. That is by connecting an impedance device 24 in parallel to the two diodes connected in series to each other. The device 24 has the substantially same impedance with that of the LDs, 11 and 12. When the device 24 has the same impedance with the LD, the forward voltage applied to the LD 11 only depends on the first modulation signal V1, similarly, the forward voltage to the LD 12 only depends on the second modulation signal V2, not on the first signal V1.

Figure 2:
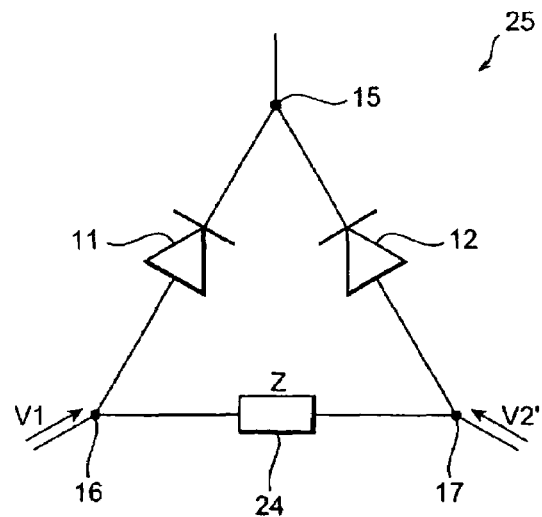
FIG. 2 shows an equivalent circuit of a primary portion of the optical transmitter to describe a mechanism of the operation thereof.

The operation of the optical transmitter 100 will be described as referring to FIGS. 1 and 2. FIG. 2 shows an equivalent circuit diagram for the two LDs, 11 and 12, and the impedance device 24. In FIG. 2, the direction of the second LD 12 is opposite to that shown in FIG. 1 and a signal V2' whose phase is opposite to that of the second signal V2 is input to the anode of the LD 12 for the explanation sake. Since the second modulation signal V2 is complementary to the input data D2, the signal V2' corresponds to the input data D2 itself.

As shown in FIG. 2, two LDs, 11 and 12, and the impedance device 24 constitute a closed loop 25. While, as shown in FIG. 1, between two LDs, 11 and 12, is connected to a circuit 75 including the resistor 53 and the compensating circuit 33. Further, the anode of the LD 11 is connected to a circuit 76 including the resistor 51, the capacitor 41 and the driver 31, and the cathode of the other LD 12 is connected to a circuit 77 including the resistor 52, the capacitor 42, the driver 32, and the current source 62. These circuits from 75 to 77 are configured out of the closed loop 25 in FIG. 2, and have substantially same impedance. In other words, the resistance of resistors, 51 to 53, are so adjusted that the circuits from 75 to 77 have substantially same impedance.

Moreover, as already explained, the impedance device 24 has substantially same impedance with that of the LDs, 11 and 12. Thus, the close loop 25 shows a symmetry configuration that nodes, 15 to 17, have substantially the same impedance with respect to ground.

Considering a situation when the input data D1 is applied in the input terminal 21 without providing the other data D2, the node 16, reflecting the input data D1, alters the electric potential thereof and nodes, 15 and 17, also alter the electrical potential. However, since the LD 11 and the device 24 have the same impedance, the node 15 and the node 17 show substantially the same behavior, which means that the both electrodes of the LD 12 show the same behavior, namely, the voltage between two electrodes of the LD 12 does not change and the LD 12 is not affected by the input signal V1.

Similarly, the signal V2' applied to the node 17 swings the potential of the node 15 and the node 16 in the same manner. Accordingly, the LD 11 is not affected by the signal V2'. Thus, the LD 11 emits light only depending on the first modulation signal V1, and the LD 12 emits light only depending on the signal V2'. This behavior of the LDs, 11 and 12, may be applicable even when the signal V2' is replaced to the second modulation signal V2.

Figure 3:
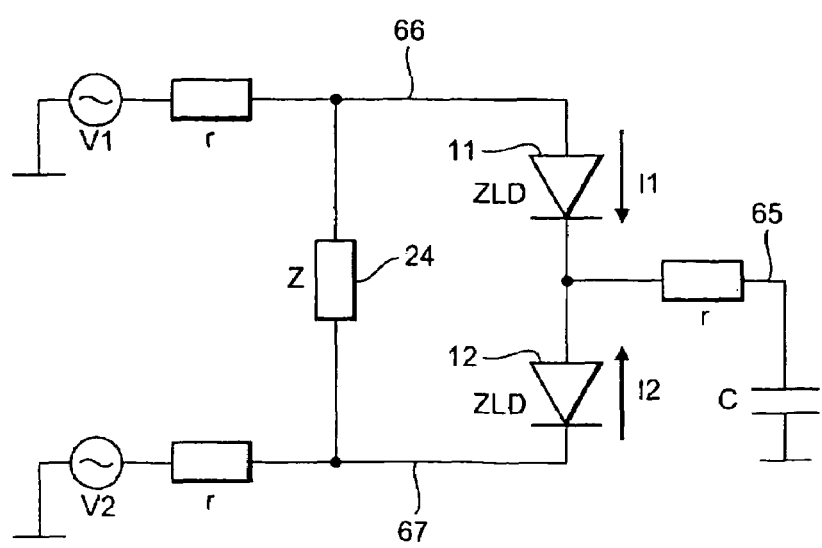
FIG. 3 is a simplified circuit diagram of the primary portion of the optical transmitter.

The behavior above will be described quantitatively as referring to FIG. 3, which simplifies the circuit diagram of the optical transmitter 100 shown in FIG. 1. In FIG. 3, the impedance of respective signal lines, 65 to 67, are denoted as r, currents flowing in respective LDs, 11 and 12, are I1 and I2, the impedance, including the junction capacitance, of the LDs is $Z_{LD}$, and the capacitance of the signal line 65 is denotes as C, respectively.

Assuming a case that the capacitance of the capacitor C is infinite; the following relation may be satisfied;

$$V1/r = \{2 + Z_{LD}/(r//Z)\}*I1 + (1 - Z_{LD}/Z)* I2 \qquad (1)$$

and $$V2/r = \{2 + Z_{LD}/(r//Z)\}*I2 + (1 - Z_{LD}/Z)* I1, \qquad (2)$$

where (A//B) means an impedance when the elements A and B are connected in parallel. From the above equations, only when $Z = Z_{LD}$, the following relations are derived;

$$V1/r = \{2 + Z_{LD}/r\}*I1 \qquad (3)$$

and, $$V2/r = \{2 + Z_{LD}/r\}*I2. \qquad (4)$$

That is, the current I1 depends only on the first modulation signal V1, while, the current I2 depends only on the second modulation signal V2.

When the capacitance of the capacitor C is finite, the relations above become;

$$V1/r = \{2 + Z_{LD}/(r//Z) + 1/(i\omega Cr)\}*I1 + \{(1 - Z_{LD}/Z + 1/(i\omega Cr)\}*I2. \qquad (5)$$

However, when the capacitor C and the resistor r have practical values, such as C=0.1 μF and r=10 Ω, respectively, and the frequency concerned is 1 MHz, the imaginary term in the equation (5) becomes $1/(i\omega Cr) \sim 0.1$. That is, the capacitance C makes faint contribution to the modulation signals, V1/r and V2/r.

Resistors from 51 to 53 in FIG. 1 are placed to compensate the difference in the output impedance of the drivers, 31 and 32, and the compensating circuit 33, or to compensate the difference in the parasitic impedance of respective signal lines, 65 to 67, thus to equalize the impedance of respective nodes connecting the LDs, 11 and 12. Oppositely speaking, the resistors, 51 to 53, may be unnecessary when the impedance of respective nodes becomes substantially equal to each other. When the impedance of the LDs, 11 and 12, is different to each other, the impedance of each node may be equalized by adjusting the resistance of resistors, 51 to 53, or by inserting an additional resistor between two LDs, 11 and 12.

It is unnecessary to fully equalize the impedance of the concerning nodes, as long as the contribution from the second modulation signal to the optical output of the LD 11 and that from the first modulation signal to the optical output of the LD 12 are suppressed to a practically acceptable level. Similarly, the impedance of the LDs, 11 and 12, and that of the impedance device 24 maybe slightly different as long as the influence on the optical output of the first LD 11 caused by the second modulation signal V2 and that of the second LD 12 caused by the first modulation signal V2 may be suppressed within a practically acceptable range.

Next, a favorable feature of the present optical transmitter 100 will be described. The optical transmitter 100 according to the first embodiment, since two LDs, 11 and 12, are connected in series, the current flowing in the first LD 11 also flows in the second LD 12. Accordingly, the current necessary to drive two LDs from the power supply $V_{CC}$ may be reduced, thereby suppressing the power consumption of the optical transmitter 100. This reduction in the power consumption can be realized without installing a specific device within the package 14, by relatively simple circuit configuration, and without increasing the count of lead pins. In particular, by adjusting the output current from the compensating circuit 33 based on the outputs of the PDs, 71 and 72, the lead pin is unnecessary to increase its count compared with a case that the output current of the compensating circuit 33 is controlled by an additional device.

Second Embodiment

Figure 4:
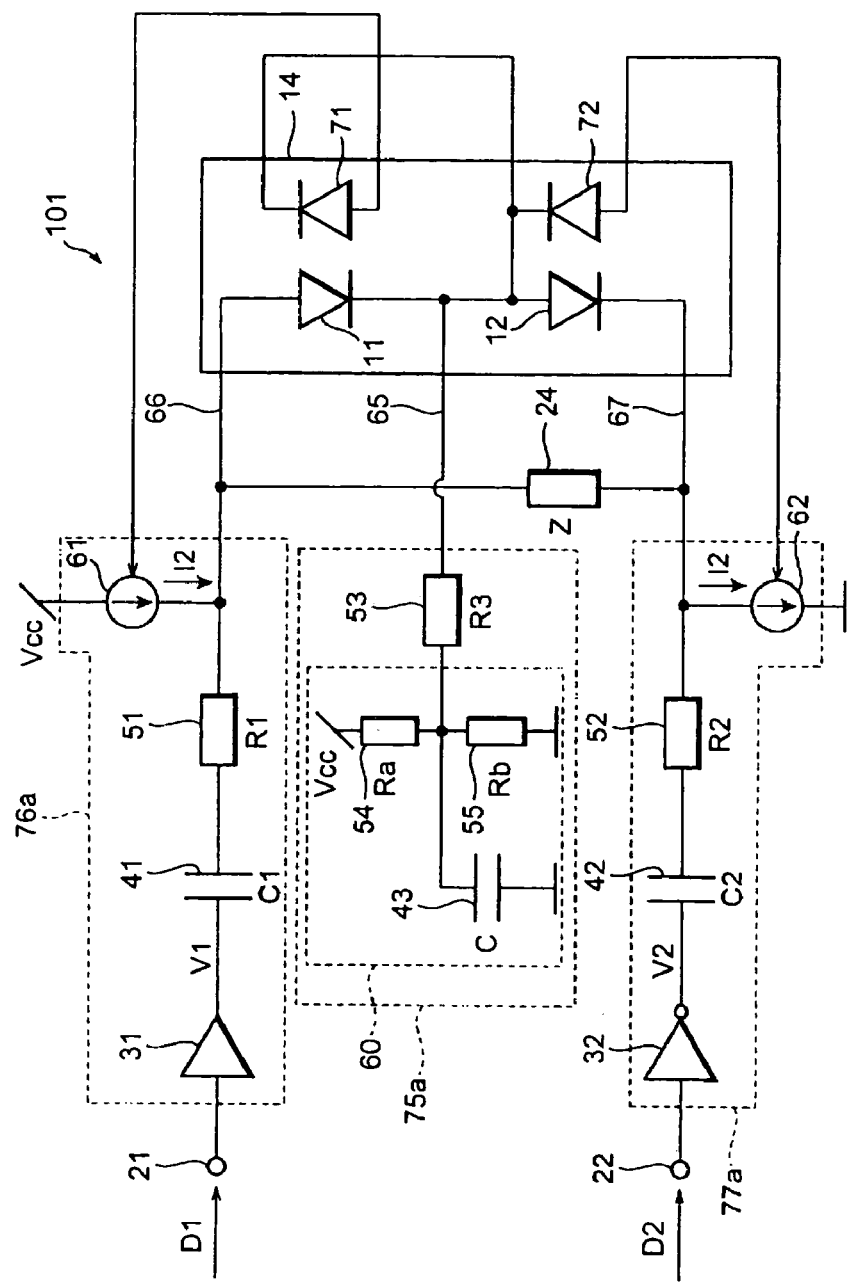
FIG. 4 is a circuit diagram of the optical transmitter according to the second embodiment of the invention.

Next, the second embodiment of the present invention will be described as referring to FIG. 4 that shows a circuit diagram of an optical transmitter 101. In the optical transmitter 100 of the first embodiment, the current flowing in the second LD 12 depends on the current source 62, while the current flowing in the first LD 11 depends on the current source 62 and the output of the compensating circuit 33. On the other hand, in the present embodiment, the first LD 11 also connects the current source 61 in FIG. 4. Therefore, the currents flowing in respective LDs depend on two current sources, 61 and 62, and the compensating circuit 33 only compensates the difference of these two currents. Accordingly, as shown in FIG. 4, the compensating circuit 33 may be replaced by a simple circuit 60 constituted by resistors, 54 and 55, and the capacitor 43.

One terminal of the capacitor 43 is connected to a resistor 53, while the other terminal is grounded. Between the capacitor 43 and the resistor 53 is connected with resistors, 54 and 55. One terminal of the resistor 54 is connected to the power supply $V_{CC}$, while another terminal of the other resistor 55 is grounded.

As shown in FIG. 2, assuming a closed loop including two LDs, 11 and 12, and one impedance device 24, a block 75a comprising a circuit 60 and the resistor 53 is connected to the node 15, a block 76a comprising the drive 31, the capacitor 41, the resistor 51 and the current source 61 is connected to the node 16, and a block 77a comprising the driver 32, the capacitor 42, the resistor 52 and the current source 62 is connected to the node 17. These blocks from 75a to 77a show substantially same impedance. Moreover, the impedance device 24 has the impedance substantially same with that of the LDs, 11 and 12. Accordingly, similar to the first embodiment shown in FIG. 1, the first LD 11 outputs the signal light corresponding only to the first modulation signal V1, while the second LD 12 outputs another signal light corresponding only to the second modulation signal V2.

Although the optical transmitter 101 provides two current sources, 61 and 62, this does not contribute to the increase of the power consumption, because two LDs, 11 and 12, are connected in series to each other and a portion of the current commonly flows in two LDs, 11 and 12. For instance, when currents of 40 mA and 35 mA are necessary to drive the first and second LDs, respectively, the respective current sources, 61 and 62, are necessary to output the currents corresponding to those flowing in each LDs, 11 and 12, and the difference in the current, which is 5 mA in this case, flows out through the resistor 53. Assuming the power supply $V_{CC}$ is 3.3 V, this optical transmitter 101 consumes the power of 40 mA×3.3 V=132 mW. On the other hand, when a conventional configuration, in which two LDs are driven in independent and in isolated, the power consumption reaches (35 mA+40 mA)× 3.3 V=248 mW.

Thus, the optical transmitter 101 shares the current in two LDs, 11 and 12, and accordingly, may reduce the power consumption compared to the case where two LDs are independently driven. This reduction in power consumption may be carried out without installing any devices within the package nor increasing the count of lead pins.

Although the present invention has been disclosed in accordance with the embodiments shown, one of ordinary skill in the art will readily recognize that there could be variations to the embodiments shown and those variations would be within the spirit and scope of the present invention.

For example, the optical transmitter shown as embodiments herein provides two LDs. However, when a number of signal channels increases, by grouping LDs into a plurality of pairs and each pair has the present configuration.

Figure 5:
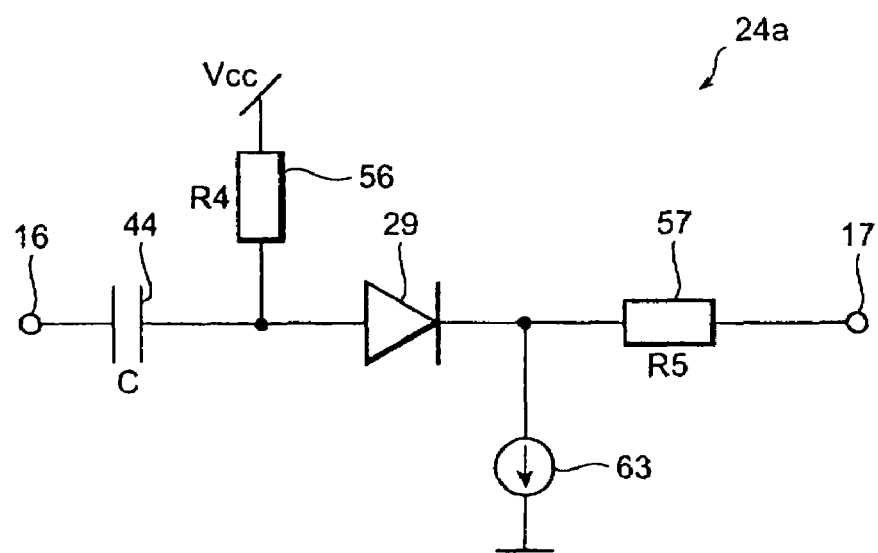
FIG. 5 shows a modification of the impedance device.

An LD may be applicable for the impedance device 24, because the impedance device 24 has the impedance substantially same with that of the LD. In another configuration, a circuit 24a shown in FIG. 5 is applied for the impedance device 24 to simulate the electrical characteristic of the LD 11 or 12. In the circuit 24a, one terminal of the capacitor 44 is connected to one input 16, which corresponds to one 66 of signal lines in FIG. 1, while the other terminal is connected to the anode of the diode 29. Between the capacitor 44 and the diode 29 is connected to one terminal of the resistor 56, while the other terminal thereof is connected to the power supply $V_{CC}$. The cathode of the diode 29 leads to one terminal of the resistor 56 and the other terminal thereof 57 is output, which corresponds to the second signal line 67 in FIG. 1. Between the diode 29 and the resistor 58 is provided with a current source 63. The diode 29 in this circuit behaves as a non-linear current source, namely, it operates as an inherent diode, while the capacitor 44 is a coupling capacitor to cut a DC component involved in the signal. Thus, the circuit 24a shown in FIG. 5 provides an impedance substantially same with that of the LDs, 11 and 12.

Under a condition that a large extinction ratio is necessary and, accordingly, the amplitude of the modulation signal is necessary to be large, the impedance of the LD may dynamically alter as depending thereon. For instance, it is occasionally considered for an LD with a threshold current of $I_{TH}$=10 mA to flow a current of $I_L$=12 mA corresponding to the low level and $I_H$=60 mA for the high level. For such LD, when the current is greater than 20 mA, I>20 mA, the impedance of the LD becomes stable in a range of 5~10 Ω. However, when the current becomes smaller than 12 mA, I<=12 mA, the impedance thereof becomes 20 Ω or greater. Therefore, the circuit 24a provides the diode 29 to compensate such large variation of the impedance.

Thus, many modifications may be made by one of ordinary skill in the art without departing from the spirit and scope of the appended claims.

What is claimed is:

1. An optical transmitter, comprising:
   a first laser diode having an anode and a cathode;
   a first driver connected to the anode of the first laser diode, the first driver receiving a first driving signal;
   a second laser diode having an anode and a cathode, the anode of the second laser diode being connected in serial to the cathode of the first laser diode;
   a second driver connected to the cathode of the second laser diode, the second driver receiving a second driving signal different from the first driving signal;

an impedance device connected between the anode of the first laser diode and the cathode of the second laser diode; and a compensating circuit connected to the cathode of the first laser diode and the anode of the second laser diode, wherein the impedance device, the first laser diode, and the second laser diode form a closed loop and have an impedance substantially the same with respect to each other, and wherein the first laser diode is driven only by the first driving signal independently of the second driving signal and the second laser diode is driven only by the second driving signal independently of the first driving signal.

2. The optical transmitter according to claim 1, wherein the compensating circuit includes a resistor with one terminal thereof connected to the cathode of the first laser diode and the anode of the second laser diode, and the other terminal thereof is grounded.

3. The optical transmitter according to claim 1, further includes first and second resistors, the anode of the first laser diode is connected to the first driver through the first resistor, and the cathode of the second laser diode is connected to the second driver through the second resistor.

4. The optical transmitter according to claim 1, wherein the compensating circuit supplies or sinks a compensating current to equalize an output power of the first laser diode to an output power of the second laser diode.

5. The optical transmitter according to claim 4, further includes a photodiode for monitoring the output power of at least one of the first laser diode and the second laser diode and outputs a compensating signal, wherein the compensating circuit adjusts the compensating current based on the compensating signal output from the photodiode.

* * * * *